(12) United States Patent
Engelhard et al.

(10) Patent No.: US 6,791,679 B2
(45) Date of Patent: Sep. 14, 2004

(54) ADAPTIVE CORRELATION OF PATTERN RESIST STRUCTURES USING OPTICAL METROLOGY

(75) Inventors: Daniel Edward Engelhard, Mountain View, CA (US); Manuel B. Madriaga, Santa Clara, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/358,782

(22) Filed: Feb. 4, 2003

(65) Prior Publication Data

US 2004/0152221 A1 Aug. 5, 2004

(51) Int. Cl.$^7$ .............................................. G01B 9/00
(52) U.S. Cl. ................................................. 356/124
(58) Field of Search ..................... 356/124; 438/14; 455/63; 355/55

(56) References Cited

U.S. PATENT DOCUMENTS 6,606,152 B2 * 8/2003 Littau et al. ................. 356/124
6,606,727 B1 * 8/2003 Yang et al. .................. 714/774

* cited by examiner

*Primary Examiner*—John F. Niebling
*Assistant Examiner*—André C. Stevenson
(74) *Attorney, Agent, or Firm*—Morrison & Foerster LLP

(57) ABSTRACT

A correlation between develop inspect (DI) and final inspect (FI) profile parameters are established empirically with test wafers. During production, a wafer is measured at DI phase to obtain DI profile parameters and FI phase profile parameters are predicted according to the DI profile parameters and the established correlation. Each wafer is subsequently measured at FI phase to obtain actual FI profile parameters and the correlation is updated with actual DI and FI profile parameters.

37 Claims, 10 Drawing Sheets

400

ADAPTIVE CORRELATION OF PATTERN RESIST STRUCTURES USING OPTICAL METROLOGY

CROSS REFERENCE TO RELATED APPLICATIONS

This application relates to co-pending U.S. patent application Ser. No. 09/727,530, entitled "System and Method for Real-Time Library Generation of Grating Profiles" by Jakatdar, et al., filed on Nov. 28, 2000.

BACKGROUND

1. Field of the Invention

The invention relates to integrated circuit (IC) metrology and more particularly to a method and system for quality monitoring of photolithography processing.

2. Related Art

Growing demands for silicon wafers with large-scale integration necessitates submicron integrated circuit (IC) features with high precision and uniformity. As the features become smaller, it is increasingly critical to monitor the photolithographic process under which such semiconductor wafers are created.

In a typical photolithographic process, a series of masks are applied in a preset sequence to a silicon wafer, each mask is used to transfer its circuitry pattern onto a photosensitive layer (i.e., a photoresist layer) that is coated onto a layer (e.g., metal layer, etc.) formed on the silicon wafer.

FIG. 1 is a flow chart 100 illustrating conventional process steps for transferring a circuitry pattern from a mask to a silicon wafer. A silicon wafer is coated with photoresist in Step 110, and the wafer is then exposed to light emitted from a device such as a scanner or stepper in Step 120. The photoresist on the wafer is then developed to form structures on the photoresist layer in Step 130, and the developed wafer is inspected to ensure the measurements of critical dimension (CD) of the structures are within that set by a design rule. The design rule regulates features such as the minimum width of a line or the minimum spacing between two lines in order to ensure that the lines do not overlap or unintentionally interact. The wafer is then selectively etched according to the pattern imprinted on the photoresist layer in Step 140. Subsequent to etching, the silicon wafer is stripped of any remaining photoresist in Step 150, and the CD measurements are again inspected in a final inspect Step 160.

As feature sizes shrink, inspection and correction of surface features cross-sectional shape ("profile"), as well as CD measurements are crucial to higher yield and device performance.

Conventional methods employ a scanning electron microscope (SEM) known as a critical dimension scanning electron microscope (CD-SEM) to inspect and measure the profile and CD measurements on a wafer. However, CD-SEM is costly and must be employed in a vacuum environment.

SUMMARY

In one exemplary embodiment, one or more test wafers are measured during a develop inspect (DI) phase and a final inspect (FI) phase in order to establish a correlation between the DI measurements and the FI measurements. A process wafer can be measured during the DI phase, and a set of FI profile parameters are predicted according to the DI profile parameters and the established correlation between the DI phase and the FI phase. The DI profile parameters, along with the predicted FI measurements are used to improve the photolithographic process by adjusting fabrication parameters or "recipe" such as etch time, or by altering and repeating the steps of the photolithographic process. Moreover, the correlation between the DI phase measurements and FI phase measurements is adaptively revised when actual DI profile parameters and FI profile parameters of each wafer are accumulated.

DESCRIPTION OF DRAWING FIGURES

The present invention can be best understood by reference to the following description taken in conjunction with the accompanying drawing figures, in which like parts may be referred to by like numerals:

Figure 8:
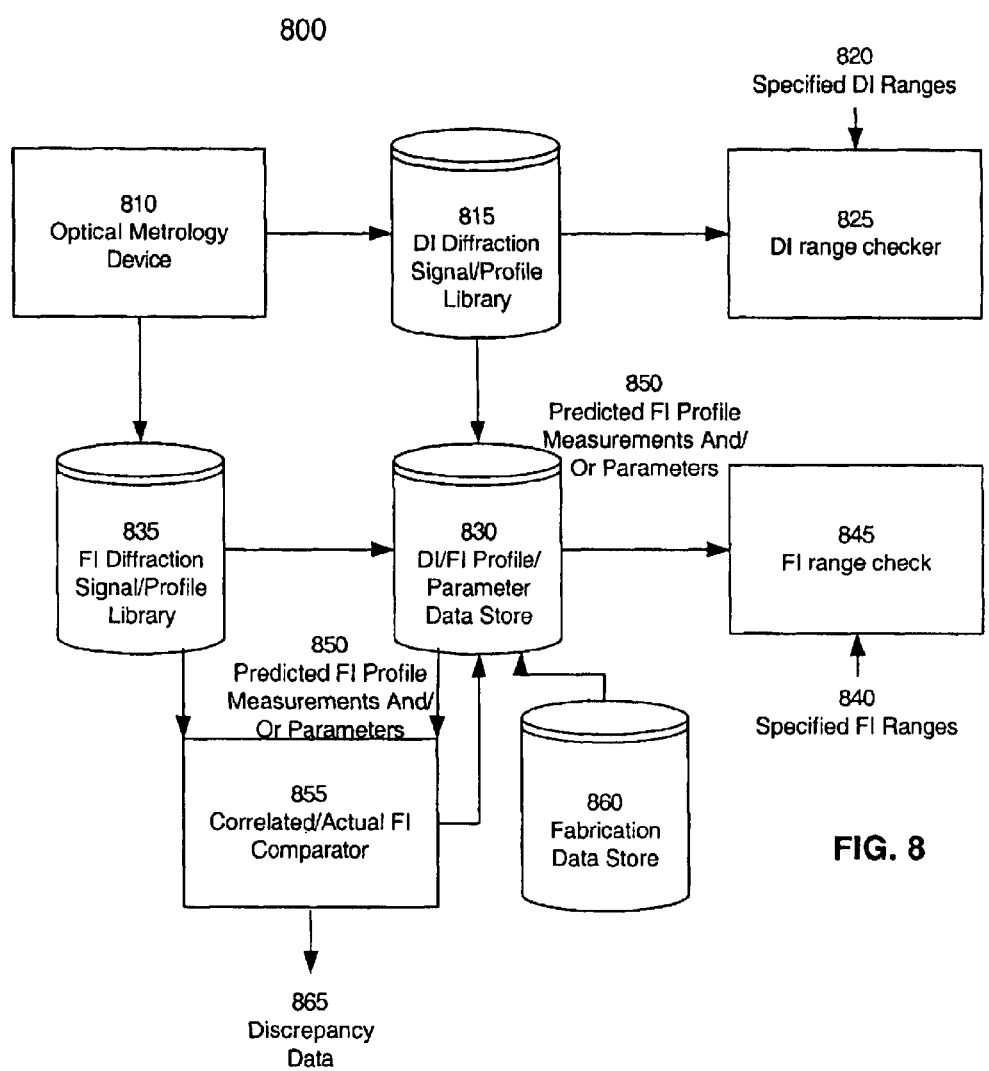

FIG. 8 is a system flow diagram illustrating an optical metrology system, a library comprising DI diffraction signal and profile pairs, a library comprising FI diffraction signal and profile pairs, a DI/FI profile/parameter data store, a DI range checker, an FI range checker, a correlated and actual FI comparator, and a fabrication data store, in accordance with an exemplary embodiment of the present invention.

DETAILED DESCRIPTION

The following description is presented to enable one of ordinary skill in the art to make and use the invention and is provided in the context of a patent application and its requirements. In the following description, specific nomenclature is set forth to provide a thorough understanding of the present invention. It will be apparent to one skilled in the art that the specific details may not be necessary to practice the present invention. Furthermore, various modifications to the embodiments will be readily apparent to those skilled in the art and the generic principles herein may be applied to other embodiments. Thus, the present invention is not intended to be limited to the embodiments shown but is to be accorded the widest scope consistent with the principles and features described herein.

In order to facilitate the description of the present invention, an ellipsometric optical metrology system is used to illustrate the concepts and principles. It is understood that the same concepts and principles equally apply to the other IC optical metrology systems such as reflectometric systems and the like.

Figure 1:
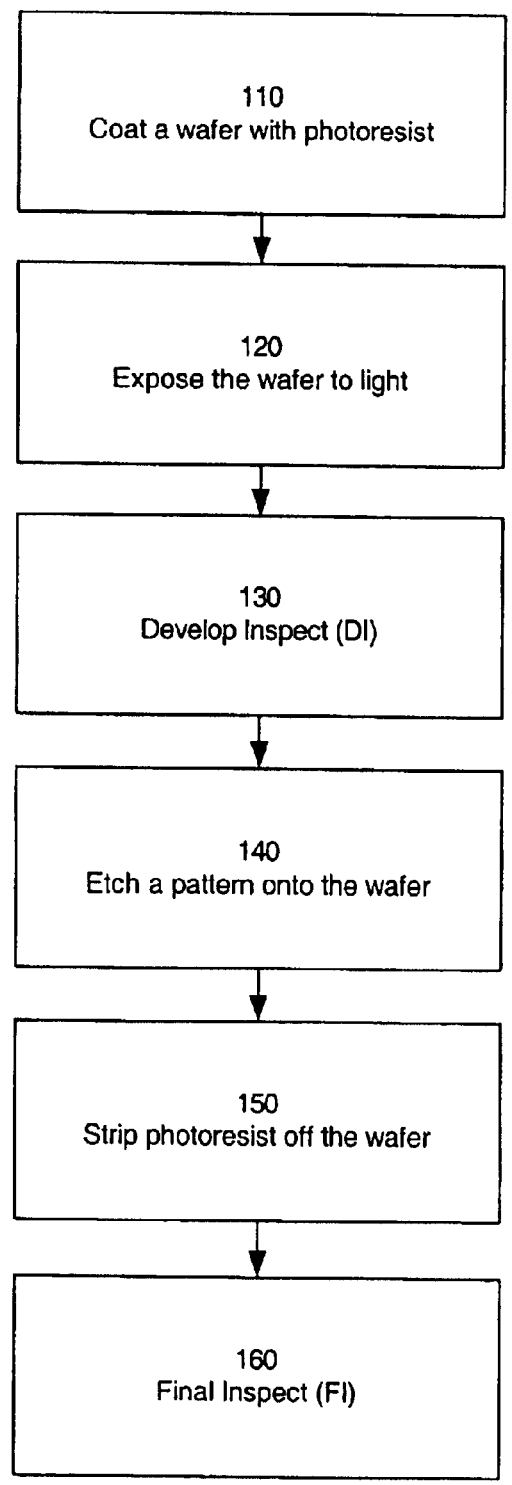
FIG. 1 is a prior art flow chart illustrating steps for transferring a circuitry pattern from a mask to a wafer.
Figure 2:
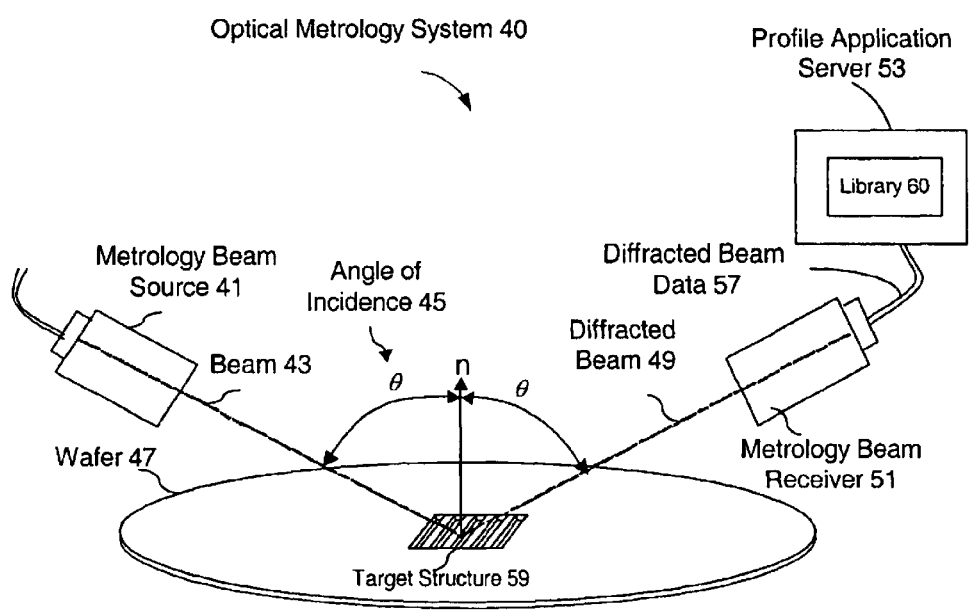
FIG. 2 is an architectural diagram illustrating an exemplary embodiment where an optical metrology device can be utilized to determine the profiles of structures on a semiconductor wafer.

FIG. 2 is an architectural diagram 200 illustrating an exemplary embodiment where optical metrology can be utilized to determine the profiles of structures on a semiconductor wafer. The optical metrology system 40 includes a metrology beam source 41 projecting a beam 43 at the target structure 59 of a wafer 47. The metrology beam 43 is projected at an incidence angle θ towards the target structure 59. The diffraction beam 49 is measured by a metrology beam receiver 51. The diffraction beam data 57 is transmitted to a profile application server 53. The profile application server 53 compares the measured diffraction beam data 57 against a library 60 of calculated diffraction beam data representing varying combinations of critical dimensions of the target structure and resolution.

In one exemplary embodiment, the library 60 instance best matching the measured diffraction beam data 57 is selected. It is understood that although a library of diffraction signals and associated profiles is frequently used to illustrate concepts and principles, the present invention equally applies to a data space comprising simulated diffraction signals and associated set of profile parameters, such as in regression, neural net, and similar methods used for profile extraction.

The profile and associated critical dimensions of the selected library 60 instance correspond to the cross-sectional profile and critical dimensions of the features of the target structure 59. The optical metrology system 40 may utilize a reflectometer, an ellipsometer, or other optical metrology device to measure the diffraction beam or signal. An optical metrology system is described in co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference.

Moreover, the optical metrology system 40 inspects wafer 47 by measuring several sample points on the wafer. Normally, both the overall inspection time and the accuracy of the inspection increase with an increasing number of sample points, and therefore the number of sample points under inspection is generally adjusted according to desired maximum inspection time and required minimum accuracy, although a minimum number of sample points may be set to ensure the adequacy of the resulting data set.

Figure 3A:
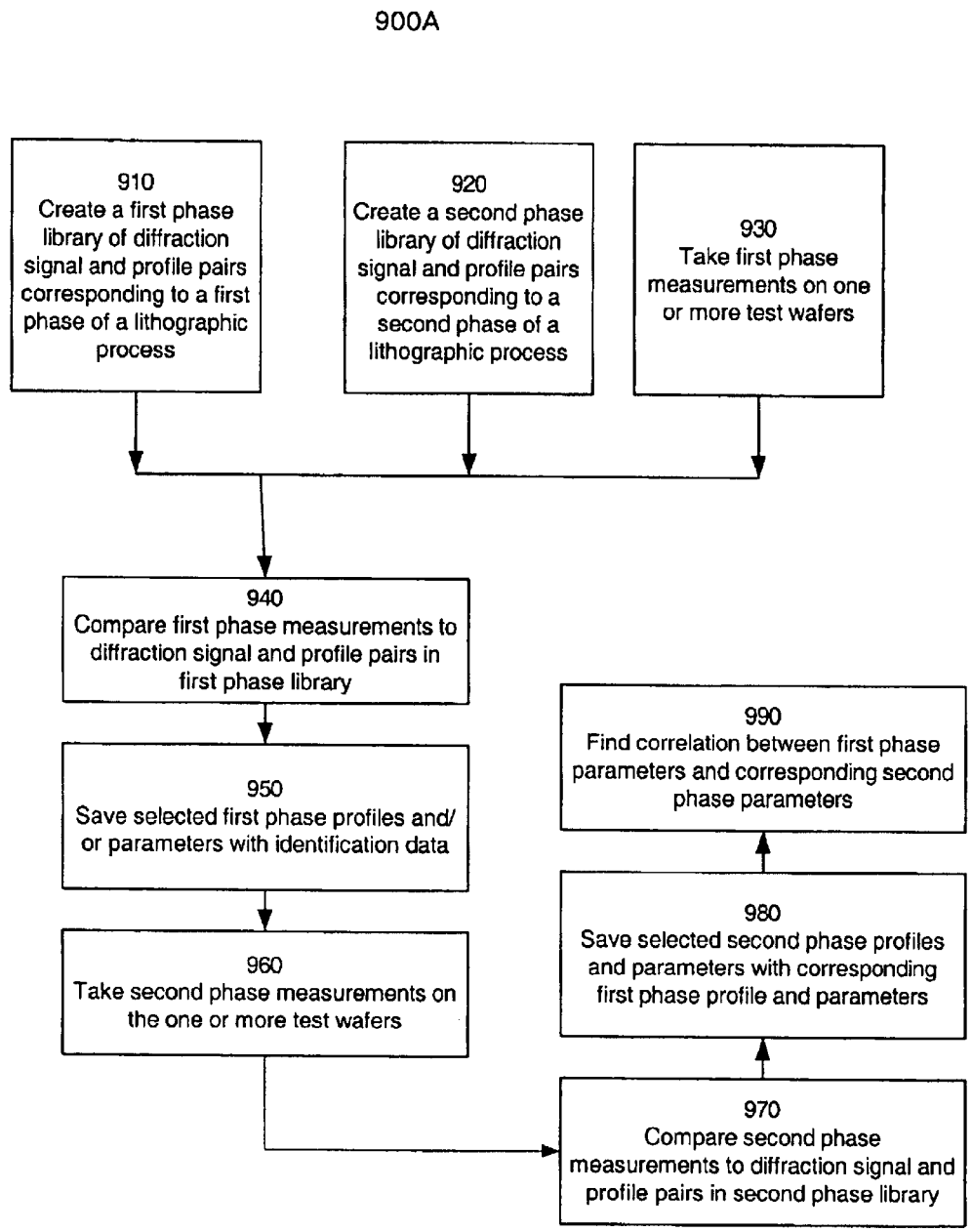
FIG. 3A is a flow chart of an exemplary process illustrating steps for establishing a correlation between fabrication process first phase profile parameters and second phase profile parameters empirically.

With reference to FIG. 3A, an exemplary process is depicted where a first phase and a second phase measurements are obtained. It should be recognized that the first and second phase measurements can correspond to measurements obtained before and subsequent, respectively, to any wafer fabrication process.

In Step 910, a first phase library comprising paired diffraction signals and associated profiles is created according to a range of parameters and resolution. The selection of parameters is specific to the application and is affected by fabrication process, type of metrology device, and the like. A method of library generation of grating profiles is described in co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference.

In Step 920, a second phase library comprising paired diffraction signals and associated profiles is created according to a corresponding set of parameters and resolution. The selection of parameters is specific to the application and is affected by fabrication process, type of metrology device, and the like. A method of library generation of grating profiles is described in co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference.

In Step 930 of FIG. 3A, each of one or more test wafers is measured during the first phase in order to obtain diffraction signals at sampled sites on each wafer. It is understood that a test wafer may be a test or production wafer with the target gratings fabricated in the wafer. Subsequent to first phase measurements, each measured diffraction signal is compared to the diffraction signal and associated profile pairs in the first phase library in Step 940, and one diffraction and profile pair, also known as a best match, is selected from the first phase library according to criteria such as goodness-of-fit. For a detailed description of techniques for measuring a wafer structure and obtaining a best match profile in a library, refer to co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference. The selected first phase profile parameters are then saved along with identification data related to fabrication process, wafer, structure, and optical metrology in Step 950.

In Step 960, each of the one or more test wafers are again measured during the second phase in order to obtain diffraction signals at sampled sites on the wafers. Moreover, each wafer is matched by the saved identification data to ensure that the same wafer is measured at the second phase at the same sites as those measured at the first phase.

Subsequent to FI measurements, each output second phase diffraction signal is compared to the diffraction signal and associated profile pairs in the second phase library in Step 970, and one diffraction signal and profile pair, also known as a best match, is selected according to criteria such as goodness-of-fit. The selected second phase profile parameters are then saved. Moreover, each second phase profile parameter for a specific site is saved correspondingly to the saved first phase profile parameter at the same site in Step 980.

In Step 990 of FIG. 3A, a correlation is established between the first phase profile parameter and the second phase profile parameter. In one exemplary embodiment, the bottom critical dimension (CD) of the first phase profile is correlated to the corresponding bottom CD of the second phase profile.

In one exemplary embodiment where a first phase profile measurement or parameter corresponds to multiple second phase profile measurements or parameters, the multiple second phase profile measurements or parameters are statistically processed to establish a correlation.

Moreover, because the correlation between the first phase profile parameters and second phase profile parameters varies with the property of the processed wafer, the correlation coefficient may be positive, negative, or zero, and a graph illustrating the relationship between the first phase and corresponding second phase may be described with a linear, quadratic, or polynomial formula. The strength of the correlation between the first phase parameters and the second phase parameters can be calculated from the formula:

$$r^2 = \frac{\left(\sum_i (x_i - \bar{x})(y_i - \bar{y})\right)^2}{\sum_i (x_i - \bar{x})^2 (y_i - \bar{y})^2} \quad (1.00)$$

where $x_i$ and $y_i$ are a pair of second phase profile parameters corresponding to two distinct first phase profile parameters, $\bar{x}$ is the mean of $x_i$'s and $\bar{y}$ is the mean of $y_i$'s. The value of $r^2$ lies between 0 and +1 inclusive. A value of +1 corresponds to either a perfect positive correlation or a perfect negative correlation, whereas a value close to 0 corresponds to a complete absence of correlation.

In one exemplary embodiment, the process illustrated in FIG. 3A is performed on one or more test wafers before actual production of process wafers in order to establish a correlation between the first phase and the second phase. The parameters used to generate the first phase library and the second phase library as well as those used to process the test wafers may vary from wafer to wafer and are selected in order to create a diverse spread in the data set. In some applications, the process of establishing the correlation between the first phase and the second phase may be done during actual production. In particular, correlation during actual production may be applicable for repeat fabrication runs. Identification data such as those saved in Step 950 are used to ensure that the same wafer is processed by the same second phase process and measured at the same sampled points by one type of optical metrology device at both the first phase and the second phase. Examples of identification data include a fabrication process identifier, a structure identifier, and an optical metrology device. A fabrication process identifier may be a specific lithography or etch process, a structure identifier may be an identifier of the site where the structure is located or an identifier of the type of IC device, and the optical metrology device may be a specific reflectometer or ellipsometer.

For the sake of example, the following set of figures and corresponding description relates to a lithographic process where a develop inspect (DI) phase is correlated to a final inspect (FI) phase. As noted above, it should be recognized, however, that the principles and concepts apply to other fabrication processes where a structure parameter prior to a fabrication process can be correlated to a structure parameter subsequent to the fabrication process.

Figure 3B:
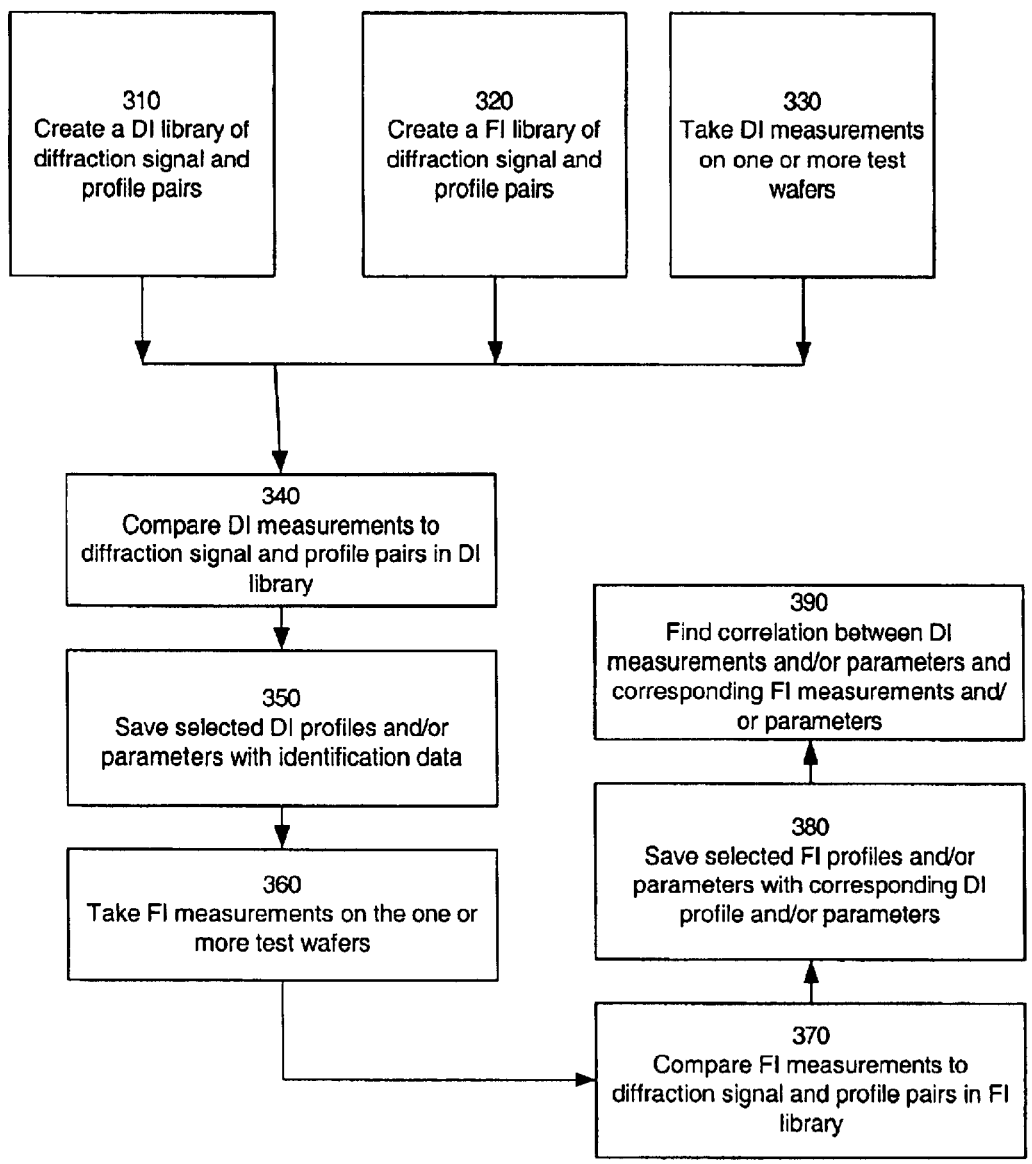
FIG. 3B is a flow chart of an exemplary process illustrating steps for establishing a correlation between DI profile parameters and FI profile parameters empirically.
Figure 3C:
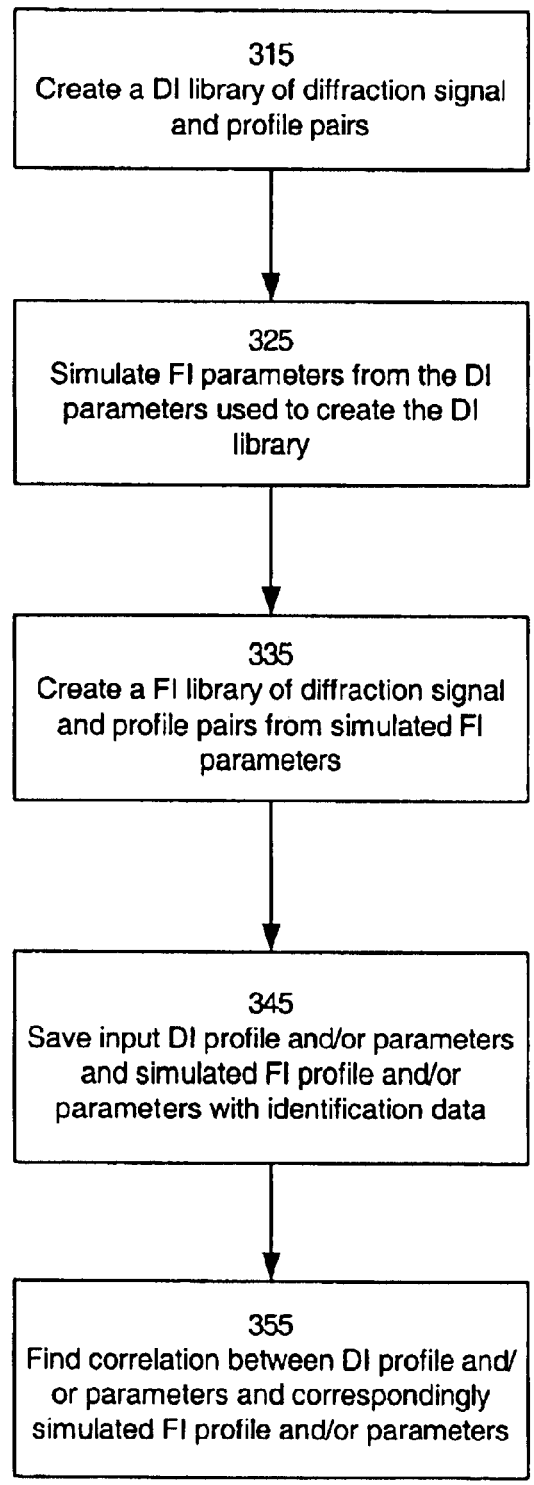
FIG. 3C is a flow chart of an alternative exemplary process illustrating steps for establishing a correlation between DI profile parameters and FI profile parameters by simulation.

FIG. 3B and FIG. 3C are flow charts 300A and 300B of exemplary processes that establish a correlation between profile parameters at the DI phase and profile parameters at the FI phase. FIG. 3B is a flow chart of an exemplary process using an empirical method, while FIG. 3C is a flow chart of an exemplary process using a process simulation method.

Referring now to flow chart 300A illustrated in FIG. 3B, in Step 310, a DI library comprising paired diffraction signals and associated profiles is created according to a range of parameters and resolution. The selection of parameters is specific to the application and is affected by fabrication process, type of metrology device, and the like. A method of library generation of grating profiles is described in co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference.

In Step 320, an FI library comprising paired diffraction signals and associated profiles is created according to a corresponding set of parameters and resolution. The selection of parameters is specific to the application and is affected by fabrication process, type of metrology device, and the like. A method of library generation of grating profiles is described in co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference.

In Step 330 of FIG. 3B, each of one or more test wafers is measured during the DI phase in order to obtain diffraction signals at sampled sites on each wafer. It is understood that a test wafer may be a test or production wafer with the target gratings fabricated in the wafer. Subsequent to DI measurements, each measured diffraction signal is compared to the diffraction signal and associated profile pairs in the DI library in Step 340, and one diffraction and profile pair, also known as a best match, is selected from the DI library according to criteria such as goodness-of-fit. For a detailed description of techniques for measuring a wafer structure and obtaining a best match profile in a library, refer to co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference. The selected DI profile measurements and/or DI parameters are then saved along with identification data related to fabrication process, wafer, structure, and optical metrology in Step 350.

In Step 360, each of the one or more test wafers are again measured during the FI phase in order to obtain diffraction signals at sampled sites on the wafers. Moreover, each wafer is matched by the saved identification data to ensure that the same wafer is measured at the FI phase at the same sites as those measured at the DI phase.

Subsequent to FI measurements, each output FI diffraction signal is compared to the diffraction signal and associated profile pairs in the FI library in Step 370, and one diffraction signal and profile pair, also known as a best match, is selected according to criteria such as goodness-of-fit. The selected FI profile measurements and/or FI parameters are then saved. Moreover, each FI profile parameter for a specific site is saved correspondingly to the saved DI profile parameter at the same site in Step 380.

In Step 390 of FIG. 3B, a correlation is established between the DI profile and the FI profile and/or between a parameter of the DI profile and the corresponding parameter of the FI profile. In one exemplary embodiment, the bottom critical dimension (CD) of the DI profile is correlated to the corresponding bottom CD of the FI profile.

In one exemplary embodiment where a DI profile measurement or parameter corresponds to multiple FI profile measurements or parameters, the multiple FI profile measurements or parameters are statistically processed to establish a correlation.

Moreover, because the correlation between the DI profile parameters and FI profile parameters varies with the property of the processed wafer, the correlation coefficient may be positive, negative, or zero, and a graph illustrating the relationship between the DI phase and corresponding FI phase may be described with a linear, quadratic, or polynomial formula. The strength of the correlation between the DI measurements and the FI measurements can be calculated from the formula:

$$r^2 = \frac{\left(\sum_i (x_i - \bar{x})(y_i - \bar{y})\right)^2}{\sum_i (x_i - \bar{x})^2 (y_i - \bar{y})^2} \quad (1.00)$$

where $x_i$ and $y_i$ are a pair of FI profile measurements or parameters corresponding to two distinct DI profile parameters, $\bar{x}$ is the mean of $x_i$'s and $\bar{y}$ is the mean of $y_i$'s. The value of $r^2$ lies between 0 and +1 inclusive. A value of +1 corresponds to either a perfect positive correlation or a perfect negative correlation, whereas a value close to 0 corresponds to a complete absence of correlation.

In one exemplary embodiment, the process illustrated in FIG. 3B is performed on one or more test wafers before actual production of process wafers in order to establish a correlation between the DI phase and the FI phase. The parameters used to generate the DI library and the FI library as well as those used to process the test wafers may vary from wafer to wafer and are selected in order to create a diverse spread in the data set. In some applications, the process of establishing the correlation between the DI phase and the FI phase may be done during actual production. In particular, correlation during actual production may be applicable for repeat fabrication runs. Identification data such as those saved in Step 350 are used to ensure that the same wafer is processed by a single etch process and measured at the same sampled points by one type of optical metrology device at both the DI phase and the FI phase. Examples of identification data include a fabrication process identifier, a structure identifier, and an optical metrology device. A fabrication process identifier may be a specific lithography or etch process, a structure identifier may be an identifier of the site where the structure is located or an identifier of the type of IC device, and the optical metrology device may be a specific reflectometer or ellipsometer.

FIG. 3C is a flow chart 300B of an exemplary process to establish a correlation between the DI phase and the FI phase by simulation. As is shown in Step 310 of FIG. 3B, a DI library comprising paired diffraction signals and profiles is created according to a range of parameters and resolution in Step 315. The selection of parameters is specific to the application and is affected by fabrication process, type of metrology device, and the like.

In Step 325, the parameters used to create the DI library in Step 315 are fed as input to a commercially available lithography simulation software such as PROLITH™ by KLA-Tencor of San Jose, Calif. USA or SOLID-C by SIGMA-C of Munich, Germany in order to simulate a set of corresponding FI parameters.

In Step 335 of FIG. 3C, an FI library comprising paired diffraction signals and profiles is created according to the parameters generated in Step 325.

Subsequently in Step 345, each of the DI profile input DI parameters used in Step 325 is saved along with corresponding simulated FI parameters and/or FI profile measurements, and identification data related to such data as fabrication process identifier and structure are recorded.

In Step 355 of FIG. 3C, a correlation is established between each saved DI profile input DI parameter and corresponding simulated FI profile parameter. In one exemplary embodiment, the bottom critical dimension (CD) of the DI profile is correlated to the corresponding bottom CD of the FI profile.

In one exemplary embodiment where a saved DI profile parameter correlates to multiple FI profile parameters, the multiple FI profile parameters are statistically processed to establish a correlation.

Moreover, because the correlation between the DI profile input DI parameters and simulated FI profile parameters varies with the property of the processed wafer, the correlation coefficient may be positive, negative, or zero, and a graph illustrating the relationship between the input DI parameters and corresponding simulated FI parameters may be described with a linear, quadratic, or polynomial formula. The strength of the correlation between the DI parameters and the FI parameters can be calculated from the formula:

$$r^2 = \frac{\left(\sum_i (x_i - \bar{x})(y_i - \bar{y})\right)^2}{\sum_i (x_i - \bar{x})^2 (y_i - \bar{y})^2} \quad (1.00)$$

where $x_i$ and $y_i$ are a pair of FI profile parameters corresponding to two distinct DI profile parameters respectively, $\bar{x}$ is the mean of $x_i$'s and $\bar{y}$ is the mean of $y_i$'s. The value of $r^2$ lies between 0 and +1 inclusive. A value of +1 corresponds to either a perfect positive correlation or a perfect negative correlation, whereas a value close to 0 corresponds to a complete absence of correlation.

In one exemplary embodiment, the process illustrated in FIG. 3C is performed before the actual production of process wafers in order to establish a correlation between the DI phase and the FI phase. The DI parameters used to generate the DI library and to simulate the FI parameters are selected in order to create a diverse spread in the data set. Identification data such as those saved in Step 345 are used to identify the fabrication process, optical metrology device, and structure for which the FI parameters are simulated. A fabrication process identifier may be a specific lithography or etch process, and a structure identifier may be an identifier of the site where the structure is located or an identifier of the type of IC device.

Figure 4:
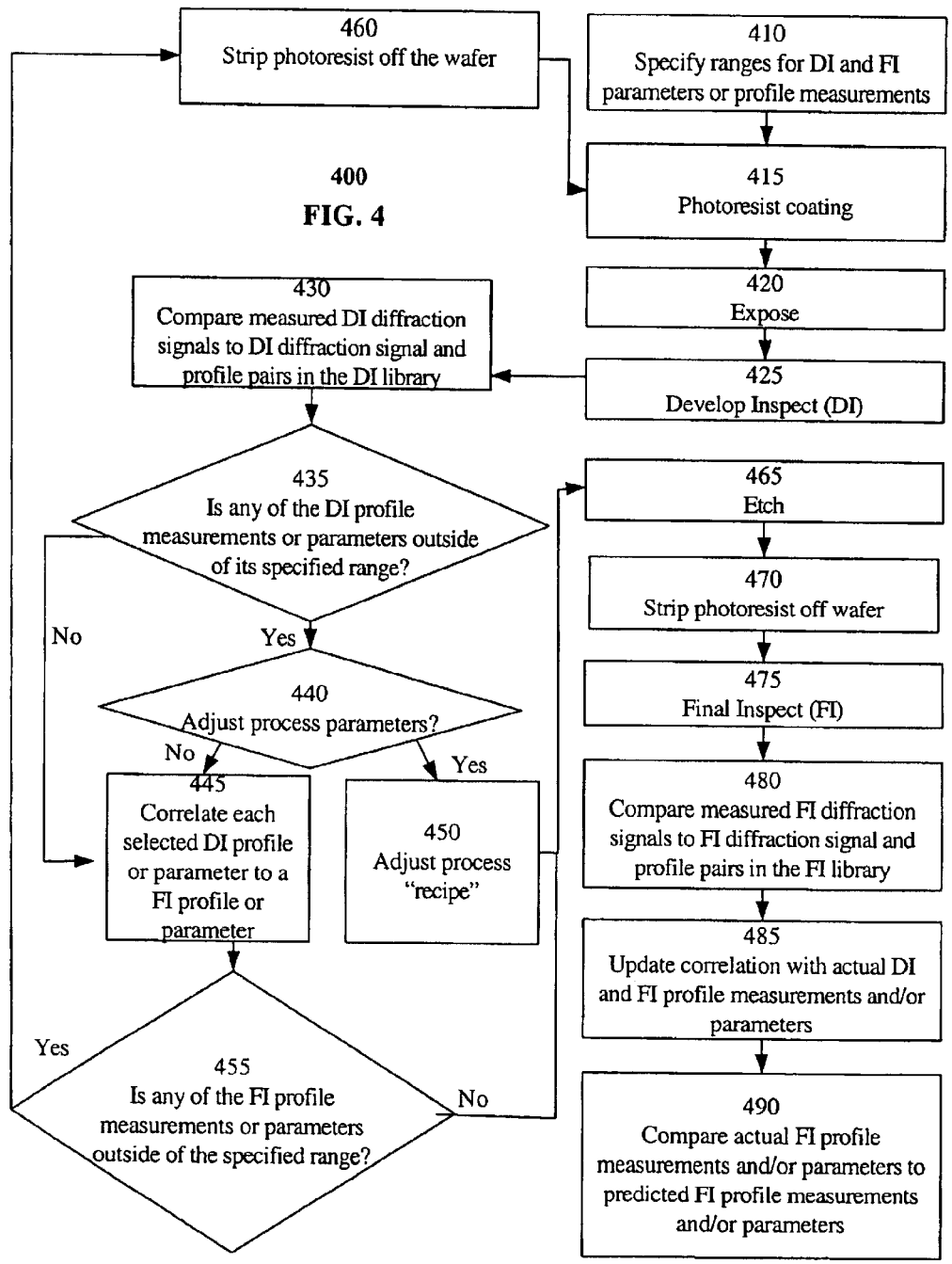
FIG. 4 is a flow chart of an exemplary process illustrating steps for transferring a circuitry pattern from a mask to a wafer, inspecting DI profile measurements, predicting FI profile parameters according to an established correlation, and adjusting the process steps according to the predicted profile parameters.

FIG. 4 is a flow chart 400 of an exemplary process to monitor and adaptively correct wafer production by correlating DI profile parameters to FI profile parameters.

Referring now to FIG. 4, in Step 410, allowable ranges are specified for both DI profile parameters and FI profile parameters. The DI ranges are specified such that in cases where a DI profile measurement or a DI parameter is outside of the specified range, the wafer is flagged as out of allowable ranges. Similarly, the FI ranges are specified such that in cases where an FI profile measurement or an FI parameter is outside of the specified range, the wafer is flagged as out of allowable ranges.

During production, photoresist is deposited on a wafer in Step 415 and exposed to light emitted from a device such as a scanner or stepper in Step 420. The photoresist on the wafer is then developed to form a pattern or set of structures that are inspected by an optical metrology device in a develop inspect (DI) phase denoted by Step 425. Moreover, the optical metrology device inspects the wafer by measuring and generating diffraction signals at several sample locations on the wafer.

In Step 430 of FIG. 4, each of the output DI diffraction signals is compared to the DI diffraction signal and profile pairs in a DI library such as those generated in Step 310 of FIG. 3B or in Step 315 of FIG. 3C, and one diffraction and profile pair, also known as a best match, is selected according to criteria such as goodness-of-fit. Each of the selected DI profile measurement is saved along with identification data such as wafer identifier, fabrication process identifier, site, etc.

In Step 435, the DI parameters and the selected DI profile measurements are checked against the specified DI ranges set in Step 410, and the wafer is flagged for any measurement that is outside of its specified range. If any DI parameter or profile measurement is outside of the specified range, in Step 440, a decision is then required to proceed to the next step or adjust the process "recipe" in Step 450 or reject the wafer. The decision on how to proceed may be automated based on system settings or may be made by a user.

In a first case illustrated in Step 450, a decision is made to adjust parameters of the process "recipe" such as a longer or shorter etch time for the current wafer and allow the lithographic process to continue to Step 465. Alternatively in Step 445, if none of the DI parameters or profile measurements is outside of the specified range or a decision is made not to adjust the process "recipe", each DI profile measurement or parameter is correlated to generate a predicted set of FI profile parameters according to the correlation established by a process such as those shown in FIG. 3B or FIG. 3C.

Figure 5:
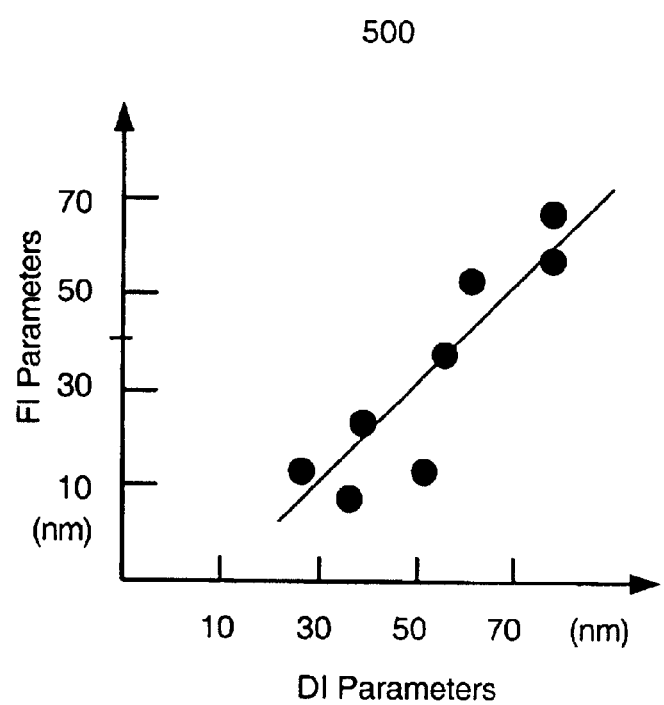
FIG. 5 is a graph illustrating one exemplary DI to FI correlation.

FIG. 5 is a graphical diagram 500 illustrating DI to FI correlation according to an exemplary embodiment. The horizontal axis represents DI parameters in nanometers and the vertical axis represents FI parameters in nanometers. Diagram 500 further illustrates that the DI parameters relate to the FI parameters with a positive and linear correlation that may be described by a linear formula 1.05DI−20=FI. In alternative embodiments, the correlation may be negative or zero and described by a quadratic or polynomial formula.

Referring now to Step 455 of FIG. 4, the set of predicted FI profile parameters are checked against the specified FI ranges set in Step 410, and the wafer is flagged for any measurement that is outside of the specified range. Moreover, if any FI profile measurement or parameter is predicted to be outside of the specified FI range, the photoresist is removed from the wafer in Step 460, and the lithographic process restarts at Step 415.

Alternatively, if each of the predicted FI profile measurements or parameters is within the specified range, the process continues to Step 465 where the wafer is etched according to the process "recipe". Subsequently, the wafer is stripped of photoresist in Step 470, and in Step 475 the wafer is again inspected in a final inspect (FI) phase by the optical metrology device at the same sites as those inspected in the DI phase denoted by Step 425.

Still referring to FIG. 4, in Step 480, each of the output FI diffraction signals is compared to FI diffraction signal and associated profile pairs from an FI library such as the library generated in Step 310 of FIG. 3B or in Step 315 of FIG. 3C, and one diffraction signal and profile pair, also known as a best match, is selected according to criteria such as goodness-of-fit. In Step 485, the actual FI profiles and/or parameters are saved, each FI profile parameter corresponding to a DI parameter; and the correlation between DI profiles and/or parameters and F! profiles and/or parameters established by a process such as shown in FIG. 3B or FIG. 3C is updated with the newly saved DI and FI profile parameters. In one exemplary embodiment, the most recently recorded FI profile parameters are assigned a greater weight than previously recorded FI profile parameters corresponding to the same DI measurement site. Moreover, all the FI profile parameters corresponding to a DI parameter are statistically processed to produce an output FI profile parameter.

Furthermore, identification data at the FI phase are matched to the saved identification data at the DI phase before updating the correlation to ensure that the same wafer and sample locations on the wafer are inspected by a single optical metrology device at both the DI phase and the FI phase.

In Step 490, the actual FI profile parameters taken in Step 475 are compared to the predicted FI profile parameters from Step 445 to verify the validity of the correlation between DI parameters and/or profile measurements and FI profiles parameters and/or profile measurements.

The process illustrated in FIG. 4 is performed on one or more wafers during production to adaptively correct measurements or parameters that are outside of a preset range by predicting a set of FI profile parameters according to the measured DI profile parameters. Identification data such as saved in Step 430 are used to identify the fabrication process, optical metrology device, and structure with which the wafer is processed and inspected. A fabrication process identifier may be a specific lithography or etch process, a structure identifier may be an identifier of the site where the structure is located or an identifier of the type of IC device, and the optical metrology device may be a specific reflectometer or ellipsometer.

Figure 6:
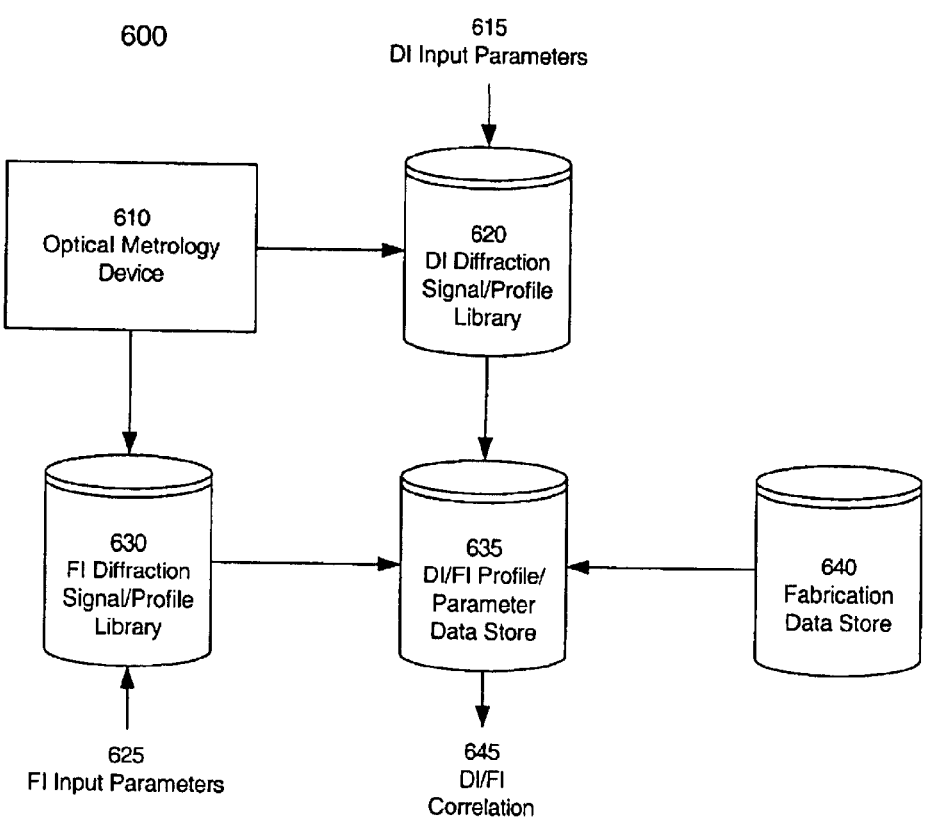
FIG. 6 is a system flow diagram illustrating an optical metrology system, a library comprising DI diffraction signal and profile pairs, a library comprising FI diffraction signal and profile pairs, a DI/FI profile/parameter data store, and a fabrication data store, in accordance with an exemplary embodiment of the present invention.

FIG. 6 is a system flow diagram 600 of a system for empirically establishing a correlation between the DI phase and the FI phase of a lithographic process according to one exemplary embodiment of the present invention. A DI diffraction signal and profile pairs library denoted 620 is generated with a set of user specified parameters denoted 615. Similarly, a library comprising FI diffraction signal and associated profile pairs denoted 630 is generated with a set of user specified parameters denoted 625. An optical metrology device 610 such as a reflectometer or an ellipsometer measures one or more test wafers at the DI and FI phase and transmits measured DI and FI diffraction signals to the DI and FI diffraction signal and profile pairs library 620 and 630 respectively. Moreover, each received DI and FI diffraction signal is compared to the diffraction signal and profile pairs in the DI and FI library respectively, one best match DI diffraction signal and profile pair, and one best match FI diffraction signal profile pair, are selected from the DI and FI library respectively according to criteria such as goodness-of-fit. The selected DI and FI profile parameters are stored along with identification data recorded in a fabrication data store 640, into a DI and FI profile parameters data store denoted 635. A correlation 645 between the DI profile parameters and FI profile parameters is generated according to data stored in DI/FI profile parameters data store 635. Moreover, the established correlation is updated as new DI profile parameters and FI profile parameters are obtained and stored.

The system illustrated in FIG. 6 is used to process one or more test wafers before actual production of process wafers in order to establish a correlation between the DI phase and the FI phase. The parameters used to generate the DI library and the FI library as well as those used to process the test wafers may vary from wafer to wafer and are selected in order to create a diverse spread in the data set.

Figure 7:
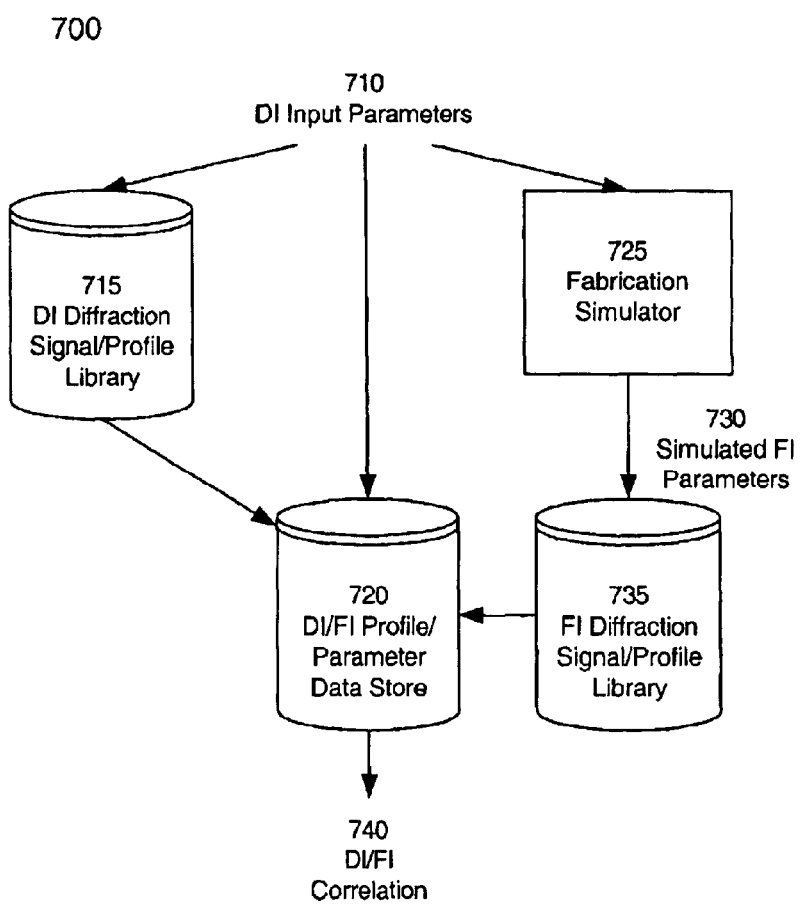
FIG. 7 is a system flow diagram illustrating an optical metrology system, a library comprising DI diffraction signal and profile pairs, a library comprising FI diffraction signal and profile pairs, a DI/FI profile/parameter data store, and a fabrication simulator, in accordance with an exemplary embodiment of the present invention.

FIG. 7 is a system flow diagram 700 of a system for establishing a correlation between the DI phase and the FI phase of a lithographic process by simulation according to one exemplary embodiment of the present invention. A DI diffraction signal and profile pairs library denoted 715 is generated with a set of user specified parameters denoted 710. The DI profile parameters are stored in a DI/FI profile parameters data store denoted 720. The DI parameters 710 are input to a fabrication simulator 725 that in turn generates a set of simulated FI parameters 730. As stated above, a fabrication simulator may be a software program such as PROLITH™ by KLA-Tencor of San Jose, Calif. USA or SOLID-C™ by SIGMA-C of Munich, Germany.

Fabrication simulator 725 outputs the simulated FI parameters to generate an FI diffraction signal and profile pairs library denoted 735. The simulated FI profile parameters are stored in the DI/FI profile parameters data store 720. A correlation 740 between the DI profile parameters and the FI profile parameters is generated according to data stored in DI/FI profile parameters data store 720. Moreover, the established correlation is updated as new DI profile parameters and FI profile parameters are obtained and stored.

The system illustrated in FIG. 7 is used to simulate a set of FI parameters with a set of user defined DI parameters before actual production of process wafers in order to establish a correlation between DI phase measurements and FI phase measurements. The parameters used to generate the DI library are selected in order to create a diverse spread in the data set.

FIG. 8 is a system flow diagram 800 of a system for monitoring and adaptively correcting a lithographic process according to one exemplary embodiment of the present invention. An established DI diffraction signal and profile pairs library denoted 815 is generated as library 620 or library 715 described in FIG. 6 and FIG. 7 respectively. An established FI diffraction signal and profile pairs library denoted 835 is generated as library 630 or library 735 described in FIG. 6 and FIG. 7 respectively.

As illustrated in FIG. 8, an optical metrology device 810 such as a reflectometer or an ellipsometer measures wafers at the DI and FI phase and transmits measured DI and FI diffraction signals to the DI and FI diffraction signal and profile pairs library 815 and 835 respectively. Having received a set of DI and FI diffraction signals from optical metrology device 810, each DI and FI diffraction signal is compared to diffraction signal and profile pairs in the DI and FI library respectively, one best match DI diffraction signal and profile pair and one best match FI diffraction signal and profile pair are selected from the DI and FI library respectively according to criteria such as goodness-of-fit. A DI range checker 825 checks each selected DI profile parameter to verify whether the measurement is within a specified range 820. Each selected DI profile parameter is stored along with identification data such as fabrication process identifier or optical metrology device identifier data recorded in a fabrication data store 860 into a DI/FI profile parameter data store 830.

The DI/FI profile parameters data store receives the transmitted DI profile parameters and outputs a set of corresponding predicted FI profile parameters according to a correlation such as those established in FIG. 6 and FIG. 7. The DI/FI profile parameters data store 830 transmits the predicted FI profile parameters 850 to an FI range checker 845 to verify whether each measurement is within a specified range 840. Furthermore, the DI/FI profile parameters data store transmits the predicted FI profile parameters 850 to a comparator 855 after optical metrology device 810 inspects the wafer during the FI phase and transmits a set of actual FI diffraction signals and/or parameters to FI library 835. The actual FI diffraction signals are compared to the FI diffraction signal and profile pairs in the FI library and a diffraction signal and profile pair, also known as a best match, is selected according to criteria such as goodness-of-fit, and the selected profile parameters are then transmitted to data store 830 as well as to comparator 855. Data store 830 receives the transmitted DI profile parameters from DI library 815 along with identification data and actual FI profile parameters and generates an updated correlation between DI measurements and FI measurements. Comparator 855 compares predicted FI measurements 850 to actual FI measurements to verify the validity of the correlation and flags any significant discrepancies with discrepancy data 865. The discrepancy data 865 may be used as feedback data to the lithography control system (not shown) to adjust process parameters in the DI phase or used as feed-forward data to adjust a process parameter in the FI phase.

In an alternative embodiment, each selected DI profile parameter from the DI library and its corresponding selected FI profile parameter along with identification data are temporarily saved in order to establish a correlation between the DI profile parameter to the FI profile parameter. The saved DI profile parameters and the FI profile parameter may be discarded when a correlation is established. Moreover, each set of new DI parameter and FI parameter is used in establishing a new correlation between DI parameter and FI parameter rather than updating the existing correlation. In one exemplary embodiment, the selected DI profile parameters and FI profile parameters are saved on the storage element on which the DI library and the FI library are stored.

It is contemplated that functional implementation of the present invention described herein may be implemented equivalently in hardware, software, firmware, and/or other available functional components or building blocks.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the arts to best utilize the invention and various embodiments with various modifications as are suited to the particular use contemplated. It is intended that the scope of the invention be defined by the claims appended hereto and their equivalents.

For example, although process steps are enumerated in an ordered sequence in FIG. 4, other process steps such as substrate cleaning or post-exposure treatment may be inserted into the sequence without altering the essence of the present invention.

Although the example illustrated in the above set of figures use a lithographic process wherein a develop inspect phase is correlated to a final inspect phase, the principles and concepts apply to other fabrication processes where a structure parameter can be correlated to the parameter of a later fabrication step.

We claim:

1. A method of empirically establishing a correlation between structure profile parameters at a develop inspect (DI) phase and structure profile parameters at a final inspect (FI) phase of a lithographic process, wherein the correlation is established prior to wafer production, the method comprising:

obtaining DI profile measurements of a wafer structure, the DI profile measurements used to determine DI profile parameters;

processing the wafer using a photolithographic process after obtaining the DI profile measurements;

obtaining FI profile measurements of the wafer structure after processing the wafer, the FI profile measurements used to determine FI profile parameters; and calculating a correlation between the DI profile parameters and corresponding FI profile parameters.

2. The method of claim 1, wherein obtaining a DI profile measurements comprises:

obtaining one or more DI diffraction signals off the wafer structure;

comparing each of the one or more diffraction signals to diffraction signals from a DI library of diffraction signals and corresponding profile parameters; and retrieving profile parameters associated with each of a best match diffraction signal from the DI library.

3. The method of claim 1, wherein obtaining an FI profile measurements comprises:

obtaining one or more FI diffraction signals off the wafer structure;

comparing each of the one or more FI diffraction signals to diffraction signals from an FI library of diffraction signals and corresponding profile parameters; and retrieving profile parameters associated to each of a best match diffraction signal from the FI library.

4. The method of claim 1, further comprising:

creating a DI library of DI diffraction signal and corresponding DI profile parameters;

obtaining one or more DI diffraction signals off the wafer structure;

comparing each of the one or more DI diffraction signals to the diffraction signals from the DI library;

determining a diffraction signal from the DI library that is a best match for each of the one or more DI diffraction signals; and retrieving profile parameters associated to each of the best match diffraction signals from the DI library.

5. The method of claim 4, wherein the diffraction signals off the wafer structures are obtained using an optical metrology device.

6. The method of claim 4, further comprising:

creating an FI library of diffraction signal and corresponding FI profile parameters;

obtaining one or more FI diffraction signals off the wafer structure;

comparing the one or more FI diffraction signals to the diffraction signals from the FI library;

determining a diffraction signal from the FI library that is a best match for each of the one or more FI diffraction signals; and retrieving profile parameters associated to each of the best match diffraction signals from the FI library.

7. The method of claim 6, wherein the one or more FI diffraction signals are obtained using an optical metrology device.

8. The method of claim 6, further comprising:

recording the DI profile parameters in a computer-readable storage medium;

recording the FI profile parameters in the computer-readable storage medium; and recording identification data regarding fabrication process, structure location, and optical metrology device in the computer-readable storage medium.

9. The method of claim 6, further comprising:

verifying that the same wafer is measured at the same sites at both the DI phase and FI phase.

10. The method of claim 6, wherein each recorded FI profile parameter corresponds to a DI profile parameter measured at the same site.

11. A method of empirically establishing an adaptive correlation between profile parameters at a develop inspect (DI) phase and profile parameters at a final inspect (FI) phase of a lithographic process, wherein the correlation is established prior to wafer production, the method comprising:

a) obtaining DI profile measurements of a wafer structure, the DI profile measurements used to determine DI profile parameters;

b) recording the DI profile parameters in a computer-readable storage medium;

c) processing the wafer using a photolithographic process after obtaining the DI profile measurements;

d) obtaining FI profile measurements of the wafer structure after processing the wafer, the FI profile measurements used to determine FI profile parameters;

e) recording the FI profile parameters in the computer readable storage medium;

f) calculating a correlation between the DI profile parameters and corresponding FI profile parameters; and g) iterating steps a) through f) for a number of wafers, wherein the correlation is recalculated and updated with the recorded DI profile parameters and FI profile parameters of each wafer.

12. The method of claim 11, further comprising:

creating a DI library of diffraction signal and corresponding DI profile parameters;

obtaining one or more DI diffraction signals off the wafer structure;

comparing each of the one or more DI diffraction signals to the diffraction signals from the DI library;

determining a diffraction signal from the DI library that is a best match for each of the one or more DI diffraction signals; and retrieving profile parameters associated to each of the best match diffraction signals from the DI library.

13. The method of claim 11, wherein the measured diffraction signals are obtained using an optical metrology device.

14. The method of claim 11, further comprising:

creating an FI library of diffraction signal and corresponding FI profile parameters;

obtaining a one or more FI diffraction signals off the wafer structure;

comparing the one or more FI diffraction signals to the diffraction signals from the FI library;

determining a diffraction signal from the FI library that is a best match for each of the one or more FI diffraction signals; and retrieving profile parameters associated to each of the best match diffraction signals from the FI library.

15. The method of claim 12, wherein the one or more diffraction signals are obtained using an optical metrology device.

16. The method of claim 11, further comprising:

recording identification data regarding fabrication process, structure location, and optical metrology device for each wafer in the computer-readable storage medium.

17. The method of claim 16, further comprising:

verifying that the same wafer is measured at the same sites at both the DI phase and FI phase for each wafer.

18. The method of claim 16, wherein each recorded FI profile parameter corresponds to a DI profile parameter measured at the same site.

19. The method of claim 11, wherein the FI profile parameters of each wafer are assigned greater weight than the FI profile parameters of previous wafers for updating the correlation.

20. A method of establishing a correlation between profile parameters at a develop inspect (DI) phase and simulated profile parameters at a final inspect (FI) phase of a lithographic process, wherein the correlation is established prior to wafer production, the method comprising:

creating a DI library of diffraction signal and profile pairs according to a set of DI parameters;

recording the DI profile and/or parameters in a computer-readable storage medium;

simulating a set of FI parameters based on the DI parameters;

creating an FI library of diffraction signal and profile pairs according to the simulated FI parameters;

recording the FI profile parameters in the computer-readable storage medium; and calculating a correlation between the DI profile parameters and corresponding FI profile parameters.

21. A method of predicting final inspect (FI) profile parameters according to develop inspect (DI) profile parameters and an existing adaptive correlation between the DI phase and the FI phase, wherein the prediction is made during wafer production, the method comprising:

specifying ranges for FI profile parameters;

obtaining DI profile measurements of wafer structures;

correlating each DI profile parameter to an FI profile parameter using an existing correlation, generating a predicted FI profile parameters; and comparing the saved FI profile parameters to the correspondingly specified FI parameter ranges.

22. The method of claim 21, wherein one or more of the predicted FI profile parameters are not within the specified FI parameter ranges, and wherein discrepancy data is generated.

23. The method of claim 22, wherein the wafer is reprocessed.

24. The method of claim 22, wherein the discrepancy data is used to adjust at least one fabrication process parameter in the DI phase and/or the discrepancy data is used to adjust at least one fabrication process parameter of the FI phase.

25. The method of claim 21, further comprising:
obtaining one or more FI diffraction signals off the wafer using one or more FI parameters, wherein each FI diffraction signal is obtained at a site where a corresponding DI profile measurement is obtained;
comparing each of the one or more FI diffraction signals to the diffraction signals from an existing FI library comprising diffraction signal and associated profile parameters;
determining a diffraction signal from the library that is a best match for each of the obtained one or more FI diffraction signals; and
retrieving the profile parameters associated to each of the best match FI diffraction signals from the library.

26. The method of claim 25, wherein the FI diffraction signal is obtained using an ellipsometer or reflectometer.

27. The method of claim 25, wherein the DI profile parameters and the retrieved FI profile parameters are stored on a computer-readable storage medium.

28. The method of claim 25, further comprising:
updating the correlation between the DI profile parameters and the retrieved FI profile parameters.

29. The method of claim 28, further comprising:
comparing the retrieved FI profile parameters to the predicted FI profile parameters.

30. The method of claim 25, further comprising:
saving the retrieved FI profile parameters;
calculating a correlation between the DI profile parameters and the saved retrieved FI profile parameters; and
replacing the existing correlation with the calculated correlation.

31. The method of claim 21, further comprising:
obtaining one or more DI diffraction signals off the test wafer;
comparing each of the one or more DI diffraction signals to the diffraction signals from an existing DI library comprising diffraction signal and associated profile parameters;
determining a diffraction signal from the DI library that is a best match for each of the one or more obtained DI diffraction signals; and
retrieving profile parameters associated to each of the best match diffraction signals from the DI library.

32. The method of claim 31, wherein the measured diffraction signals are obtained using an ellipsometer or reflectometer.

33. A method of correlating profile parameters of a wafer structure formed on a semiconductor wafer, the method comprising:
obtaining a first set of profile measurements of a wafer structure;
determining a first set of profile parameters based on the first set of profile measurements;
processing the wafer using a photolithographic process after obtaining the first set of profile measurements;
obtaining a second set of profile measurements of the wafer structure after processing the wafer;
determining a second set of profile parameters based on the second set of profile measurements; and
calculating a correlation between at least one of the first set of profile parameters and at least one of the second set of profile parameters.

34. The method of claim 33, wherein obtaining a first set of profile measurements comprises:
obtaining one or more diffraction signals off the wafer structure;
comparing each of the one or more diffraction signals to diffraction signals from a first library of diffraction signals and corresponding profile parameters; and
retrieving profile parameters associated with each of a best match diffraction signal from the first library.

35. The method of claim 34, wherein obtaining a second set of profile measurements comprises:
obtaining one or more diffraction signals off the wafer structure;
comparing each of the one or more diffraction signals to diffraction signals from a second library of diffraction signals and corresponding profile parameters; and
retrieving profile parameters associated to each of a best match diffraction signal from the second library.

36. The method of claim 33, further comprising:
storing the first set of profile parameters;
storing the second set of profile parameters; and
storing identification data regarding fabrication process, structure location, and optical metrology device.

37. The method of claim 33, further comprising:
verifying that the first and second sets of profile measurements are obtained at the same sites on a wafer.

* * * * *